(12) United States Patent
Kim et al.

(10) Patent No.: US 12,183,591 B2
(45) Date of Patent: Dec. 31, 2024

(54) ETCHING GAS COMPOSITIONS, METHODS OF FORMING MICROPATTERNS, AND METHODS OF MANUFACTURING SEMICONDUCTOR DEVICE

(71) Applicant: Samsung Electronics Co., Ltd., Suwon-si (KR)

(72) Inventors: Dohoon Kim, Seongnam-si (KR); Wonwoong Chung, Incheon (KR); Taehyung Kim, Seoul (KR); Heejun Park, Cheongju-si (KR); Handuck Song, Daejeon (KR); Heonjong Jeong, Cheongju-si (KR); Younglae Kim, Sejong-si (KR); Byeongok Cho, Cheongju-si (KR)

(73) Assignees: SAMSUNG ELECTRONICS CO., LTD., Suwon-si (KR); WONIK MATERIALS, Cheongju-si (KR)

( * ) Notice: Subject to any disclaimer, the term of this patent is extended or adjusted under 35 U.S.C. 154(b) by 31 days.

(21) Appl. No.: 17/701,846

(22) Filed: Mar. 23, 2022

(65) Prior Publication Data
US 2022/0310407 A1    Sep. 29, 2022

(30) Foreign Application Priority Data
Mar. 24, 2021    (KR) .................. 10-2021-0038291

(51) Int. Cl.
*H01L 21/467*    (2006.01)
*C09K 13/00*    (2006.01)
*H01L 21/311*    (2006.01)

(52) U.S. Cl.
CPC ............ *H01L 21/467* (2013.01); *C09K 13/00* (2013.01); *H01L 21/31111* (2013.01)

(58) Field of Classification Search
CPC ........ C09K 13/00; C09K 13/06; C09K 13/08; H01L 21/467; H01L 21/31111
See application file for complete search history.

(56) References Cited

U.S. PATENT DOCUMENTS

| | | | |
|---|---|---|---|
| 7,919,141 B2 | 4/2011 | Tanioka et al. |
| 8,614,151 B2 | 12/2013 | Benson et al. |
| 9,017,571 B2 | 4/2015 | Umezaki et al. |
| 9,514,959 B2 | 12/2016 | Anderson et al. |

(Continued)

OTHER PUBLICATIONS

National Library of Medicine, "1,2,3,4-Tetrafluorocyclobutane" via https://pubchem.ncbi.nlm.nih.gov/compound/1_2_3_4-Tetrafluorocyclobutane ; pp. 1-12, No date available.*

(Continued)

*Primary Examiner* — Binh X Tran
(74) *Attorney, Agent, or Firm* — Myers Bigel, P.A.

(57) ABSTRACT

An etching gas composition includes a first organofluorine compound having 3 to 6 carbon atoms, and an organosulfur compound having 1 to 4 sulfur atoms. The organosulfur compound may include a carbon-fluorine (C—F) bond, a carbon-sulfur (C—S) bond, at least one carbon-carbon double (—C═C—) bond. When the etching gas composition is used, excellent etch selectivity may be obtained, and the linearity and verticality of a pattern may be greatly increased by improving line edge roughness (LER) and line width roughness (LWR) due to an improvement in the roughness of an etched surface.

16 Claims, 15 Drawing Sheets

(56) References Cited

U.S. PATENT DOCUMENTS

| | | | |
|---|---|---|---|
| 9,748,366 B2 | 8/2017 | Kim et al. | |
| 2016/0293430 A1* | 10/2016 | Choi | H01L 21/31116 |
| 2017/0032976 A1* | 2/2017 | Anderson | C07C 17/263 |
| 2017/0352546 A1 | 12/2017 | Gupta et al. | |
| 2019/0148167 A1* | 5/2019 | Kim | H10B 12/482 |
| | | | 252/79 |
| 2020/0234962 A1* | 7/2020 | Kato | H01L 21/31116 |
| 2021/0391178 A1* | 12/2021 | Shimizu | C09K 13/00 |
| 2022/0157614 A1* | 5/2022 | Oomori | H01L 21/31144 |

OTHER PUBLICATIONS

National Library of Medicine, "1,1,2,2,3-Pentafluorocyclobutane" via https://pubchem.ncbi.nlm.nih.gov/compound/1_1_2_2_3-Pentafluorocyclobutane ; pp. 1-18; No date available.*

Libretexts Chemistry, "The Ideal Gas Law" https://chem.libretexts.org/Bookshelves/Physical_and_Theoretical_Chemistry_Textbook_Maps/Supplemental_Modules_(Physical_and_Theoretical_Chemistry)/Physical_Properties_of_Matter/States_of_Matter/Properties_of_Gases/Gas_Laws/The_Ideal_Gas_Law ; No date available.*

ChemSrc "2,2,3,4,5,5-hexafluorothiophene" via https://www.chemsrc.com/en/cas/380-40-5_480908.html ; pp. 1-4, No date available.*

National Library of Medicine "(2Z) 1,1,1,4,4,4-hexafluoro-2-butene" via https://pubchem.ncbi.nlm.nih.gov/compound/52991879 ; pp. 1-27; No date available.*

* cited by examiner

ETCHING GAS COMPOSITIONS, METHODS OF FORMING MICROPATTERNS, AND METHODS OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2021-0038291, filed on Mar. 24, 2021, in the Korean Intellectual Property Office, the disclosure of which is incorporated by reference herein in its entirety.

BACKGROUND

The inventive concept relates to a method of forming patterns (e.g., micropatterns) and a method of manufacturing an integrated circuit device (e.g., a vertical semiconductor device), and more particularly, to an etching gas composition, which has an excellent etch selectivity and greatly increases the linearity and verticality of patterns by improving line edge roughness (LER) and line width roughness (LWR) due to an improvement in the roughness of an etched surface, a method of forming patterns (e.g., micropatterns) using the etching gas composition, and a method of manufacturing an integrated circuit device (e.g., a vertical semiconductor device) using the etching gas composition.

With an increase in the integration density of semiconductor devices, pattern sizes have been continuously reduced. In particular, in a vertically stacked three-dimensional (3D) structure, it may be beneficial to improve an etch selectivity between a mask and a film to be processed and to increase pattern linearity and verticality for improving a pattern profile (e.g., reducing bowing and tapering).

SUMMARY

The inventive concept provides an etching gas composition, which has excellent etch selectivity and greatly increases the linearity and verticality of patterns by improving line edge roughness (LER) and line width roughness (LWR) due to an improvement in the roughness of an etched surface.

The inventive concept also provides a method of forming patterns (e.g., micropatterns), which may greatly increase the linearity and verticality of patterns by improving LER and LWR using the etching gas composition.

Furthermore, the inventive concept provides a method of manufacturing a semiconductor device (e.g., a vertical semiconductor device), which may greatly increase the linearity and verticality of patterns by improving LER and LWR using the etching gas composition.

According to an aspect of the inventive concept, there is provided an etching gas composition including a first organofluorine compound having 3 to 6 carbon atoms and an organosulfur compound having 1 to 4 sulfur atoms. The organosulfur compound may include a carbon-fluorine (C—F) bond, a carbon-sulfur (C—S) bond, and at least one carbon-carbon double (—C=C—) bond.

According to another aspect of the inventive concept, there is provided an etching gas composition including a first organofluorine compound having a formula of $C_aF_bH_c$, and an organosulfur compound having a formula of $C_xF_yS_z$ and including at least one carbon-carbon double (—C=C—) bond. A content of the organosulfur compound is in a range of about 1 part to about 100 parts, based on 100 parts by mole of the first organofluorine compound. Herein, a is an integer of 3 to 6, b is an integer of 1 to 10, c is an integer of 1 to 6, x is an integer of 1 to 6, y is an integer of 1 to 16, and z is an integer of 1 to 4.

According to another aspect of the inventive concept, there is provided a method of forming patterns. The method includes forming a film on a substrate, forming an etch mask on the film, and etching the film by performing an etch process on the etch mask using the etching gas composition according to some embodiments of the inventive concept. In some embodiments, the method may further include removing the etch mask.

According to another aspect of the inventive concept, there is provided a method of manufacturing a semiconductor device. The method includes alternately and repeatedly sacrificial films and insulating films on a substrate, forming a hard mask pattern on the sacrificial films and the insulating films, forming a sulfur-containing passivation layer on a sidewall of the hard mask pattern, forming a channel hole that extends through the sacrificial films and the insulating films using the hard mask pattern as an etch mask, forming a vertical channel structure in the channel hole, and replacing the sacrificial films by gates. The formation of the sulfur-containing passivation layer and the formation of the channel hole may include supplying a first etching gas composition. The first etching gas composition may include a first organofluorine compound having 3 to 6 carbon atoms and an first organosulfur compound having 1 to 4 sulfur atoms. The first organosulfur compound may include a C—F bond, a C—S bond, and at least one carbon-carbon double (—C=C—) bond.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
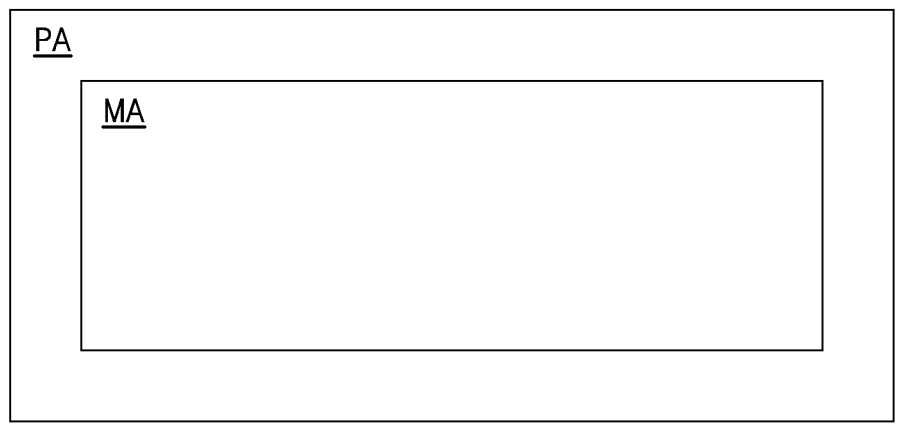
FIG. 1 is a schematic plan view of a semiconductor device according to some embodiments of the inventive concept.

Hereinafter, example embodiments will be described in detail with reference to the accompanying drawings.

An etching gas composition according to some embodiments of the inventive concept may include a first organofluorine compound and an organosulfur compound.

First Organofluorine Compound

The first organofluorine compound may include a C3 to C6 organofluorine compound. In some embodiments, the first organofluorine compound may have a formula of $C_aF_bH_c$. Wherein: a may be an integer of 3 to 6, b may be an integer of 1 to 10, and c may be an integer of 1 to 6.

In some embodiments, the first organofluorine compound may include at least one selected from trifluoropropane, tetrafluoropropane, pentafluoropropane, hexafluoropropane, tetrafluoropropene, difluoropropane, pentafluorobutane, heptafluorobutane, octafluorobutane, hexafluorobutene, decafluoropentane, hexafluorocyclopentane, heptafluorocyclopentane, octafluorocyclopentane, heptafluorocyclopentene, and nonafluorohexene.

In some embodiments, the first organofluorine compound may include at least one selected from the group of 1h-heptafluoropropane, 1,1,1,2,3,3,3-heptafluoropropane, 1,1,1,2,2,3-hexafluoropropane, 1,1,1,2,3,3-hexafluoropropane, 1,1,1,3,3,3-hexafluoropropane, 1,1,2,2,3,3-hexafluoropropane, 1,1,2,2,3-pentafluoropropane, 1,1,1,2,2-pentafluoropropane, 1,1,2,3,3-pentafluoropropane, 1,1,1,2,3-pentafluoropropane, 1,1,1,3,3-pentafluoropropane, 1,1,2,2-tetrafluoropropane, 1,1,1,2-tetrafluoropropane, 1,2,2,3-tetrafluoropropane, 1,1,1,3-tetrafluoropropane, 1,1,3,3-tetrafluoropropane, 1,1,2,3-tetrafluoropropane, 1,1,3-trifluoropropane, 1,1,2-trifluoropropane, 1,2,3-trifluoropropane, 1,1,2-trifluoropropane, 1,1,1-tifluoropropane, 1,1-difluoropropane, 1,2-difluoropropane, 2,2-difluoropropane, 1-fluoropropane, 2-fluoropropane, 1,1,3,3,3-pentafluoroprop-1-ene, 1,1,2,3,3-pentafluoroprop-1-ene, 1,2,3,3,3-pentafluoroprop-1-ene, 1,3,3,3-tetrafluoroprop-1-ene, 1,1,3,3-tetrafluoroprop-1-ene, 2,3,3,3-tetrafluoroprop-1-ene, 1,2,3,3-tetrafluoroprop-1-ene, 1,1,2,3-tetrafluoroprop-1-ene, 3,3,3-trifluoroprop-1-ene, 1,1,3-trifluoroprop-1-ene, 1,3,3-trifluoroprop-1-ene, 1,1,2-trifluoroprop-1-ene, 1,2,3-trifluoroprop-1-ene, 2,3,3-trifluoroprop-1-ene, 1,1-difluoroprop-1-ene, 1,3-difluoroprop-1-ene, 3,3-difluoroprop-1-ene, 1,2-difluoroprop-1-ene, 2,3-difluoroprop-1-ene, 1-fluoroprop-1-ene, 2-fluoroprop-1-ene, 3-fluoroprop-1-ene, 1,1,1,2,2,3,3,4,4-nonafluorobutane, 1,1,1,2,2,3,4,4,4-nonafluorobutane, 1,1,1,2,2,3,3,4-octafluorobutane, 1,1,1,2,2,4,4,4-octafluorobutane, 1,1,2,2,3,3,4,4-octafluorobutane, 1,1,1,2,2,3,4,4-octafluorobutane, 1,1,1,2,3,4,4,4-octafluorobutane, 1,1,1,2,3,3,4,4-octafluorobutane, 1,1,1,2,2,3,3-heptafluorobutane, 1,1,1,2,2,4,4-heptafluorobutane, 1,1,1,3,3,4,4-heptafluorobutane, 1,1,2,2,3,3,4-heptafluorobutane, 1,1,1,2,4,4,4-heptafluorobutane, 1,1,1,2,2,3,4-heptafluorobutane, 1,1,1,2,3,4,4-heptafluorobutane, 1,1,2,2,3,4,4-heptafluorobutane, 1,1,1,2,2,3-hexafluorobutane, 1,1,1,2,3,3-hexafluorobutane, 1,1,2,2,3,3-hexafluorobutane, 1,1,3,3,4-hexafluorobutane, 1,1,1,2,2,4-hexafluorobutane, 1,1,1,3,3,4-hexafluorobutane, 1,2,2,3,3,4-hexafluorobutane, 1,1,1,4,4,4-hexafluorobutane, 1,1,1,2,3,4-hexafluorobutane, 1,1,2,2,3,4-hexafluorobutane, 1,1,2,3,3,4-hexafluorobutane, 1,1,1,3,4,4-hexafluorobutane, 1,1,1,2,4,4-hexafluorobutane, 1,1,2,2,4,4-hexafluorobutane, 1,1,2,3,4,4-hexafluorobutane, 1,1,1,2,2-pentafluorobutane, 1,1,1,3,3-pentafluorobutane, 1,1,1,4,4-pentafluorobutane, 1,1,1,2,3-pentafluorobutane, 1,1,1,2,4-pentafluorobutane, 1,1,1,3,4-pentafluorobutane, 1,1,2,2,3-pentafluorobutane, 1,1,2,2,4-pentafluorobutane, 1,1,3,3,4-pentafluorobutane, 1,1,2,3,3-pentafluorobutane, 1,1,2,4,4-pentafluorobutane, 1,2,2,3,3-pentafluorobutane, 1,1,2,3,4-pentafluorobutane, 1,2,2,3,4-pentafluorobutane, 1,1,2,2,3,3,4-heptafluorocyclopentane, 1,1,2,2,3,3-hexafluorocyclopentane, 1h,2h-octafluorocyclopentane, 3,3,4,4,5,5-hexafluorocyclopentene, 1,3,3,4,4,5,5-heptafluorocyclopentene, 2h,3h-decafluoropentane, and 3,3,4,4,5,5,6,6,6-nonafluorohex-1-ene.

In some embodiments, the first organofluorine compound may include hexafluorobutene. Specifically, the first organofluorine compound may include at least one selected from the group of (2E)-1,1,1,4,4,4-hexafluoro-2-butene, (2Z)-1,1,1,4,4,4-hexafluoro-2-butene, 1,1,3,3,3-pentafluoro-2-(fluoromethyl)prop-1-ene, (3S,4R)-1,1,2,2,3,4-hexafluorocyclobutane, 2,3,3,4,4,4-hexafluoro-1-butene, 1,1,2,2,3,3-hexafluorocyclobutane, (2Z)-1,1,1,2,4,4-hexafluoro-2-butene, and (2E)-1,1,2,3,4,4-hexafluoro-2-butene.

Organosulfur Compound

The organosulfur compound may include a carbon-fluorine (C—F) bond and a carbon-sulfur (C—S) bond and may be an S1 to S4 organosulfur compound.

In some embodiments, the organosulfur compound may be a 5-membered or 6-membered heterocyclic compound containing sulfur as a heteroelement. In some embodiments, the organosulfur compound may have a formula of $C_xF_yS_z$, wherein x may be an integer of 1 to 6, y may be an integer of 1 to 16, and z may be an integer of 1 to 4.

In some embodiments, the organosulfur compound may include at least one carbon-sulfur-carbon (C—S—C) bond and/or at least one double bond (e.g., —C=C—). In some embodiments, the organosulfur compound may be a 5-membered or 6-membered heterocyclic compound including only one sulfur atom.

In some embodiments, the organosulfur compound may include at least one selected from the group of methanethioyl fluoride, difluoromethanethione, trifluormethanthiyl-radical, trifluoro(trifluoromethyl)sulfur(IV), pentafluoro(trifluoromethyl)-$\lambda^6$-sulfane, trifluoromethylmercaptothiocarbonyl fluoride, 2,2,4,4-tetrafluoro-1,3-dithietane, trifluoro(trifluoromethylsulfanyl)methane, trifluoro-(trifluoromethyldisulfanyl)methane, trifluoro-(trifluoromethyltrisulfanyl)methane, trifluoro-(trifluoromethyltetrasulfanyl) methane, difluorobis(trifluoromethyl)sulfur(IV), 1,1,2-trifluoro-2-pentafluorosulfanylethene, bis(trifluoromethyl)tetrafluorosulfur(VI), pentafluoro(1,1,2,2,2-pentafluoroethyl)-?$^6$-sulfane, hexafluorothioacetone, bis(trifluoromethylsulfanyl)methanethione, 3,3,3-trifluoro-1-pentafluorosulfanyl-1-propyne, hexadecafluoro-octahydro-1,4-dithiane, 3,3,3-trifluoro-2-(trifluoromethyl)prop-1-ene-1-thione, 2,2,3,4,5,5-hexafluorothiophene, 3,4-bis(trifluoromethyl)dithiete, bis(trifluoromethylmercapto)acetylene, perfluorotetrahydrothiophene, 2,2-difluoro-3,3-bis(trifluoromethyl)thiirane, and perfluorocyclohexanesulfurpentafluoride.

In some embodiments, the organosulfur compound may include and/or have a formula of $C_4F_6S$. In some embodiments, the organosulfur compound may have a formula of one of:

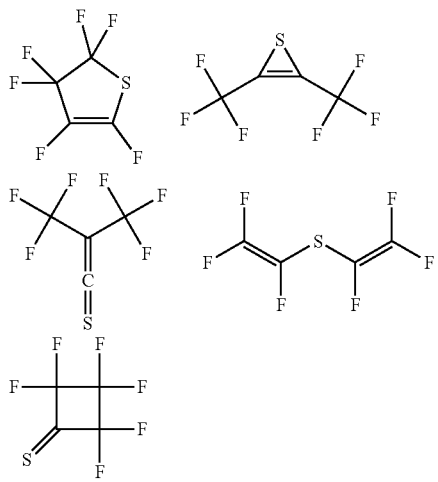

In some embodiments, the organosulfur compound may not include a hydrogen atom.

The first organofluorine compound may be contained in the etching gas composition in a predetermined ratio with the organosulfur compound. In some embodiments, a content of the organosulfur compound may be in a range of about 1 part to about 100 parts by mole, based on 100 parts by mole of the first organofluorine compound. In some embodiments, a content of the organosulfur compound may be in a range of about 5 parts to about 95 parts by mole, about 5 parts to about 90 parts by mole, about 5 parts to about 80 parts by mole, about 10 parts to about 70 parts by mole, about 10 parts to about 60 parts by mole, about 15 parts to about 50 parts by mole, about 20 parts to about 50 parts by mole, or in any range between the numerical values described above, based on 100 parts by mole of the first organofluorine compound.

When a mixture ratio of the first organofluorine compound and the organosulfur compound is the same as described above, desired etch rate and etch selectivity may be obtained. Specifically, when a content of the organosulfur compound is excessively low, the formation of a sulfur-containing passivation layer may be unsatisfactory. Conversely, when the content of the organosulfur compound is excessively high, etch selectivity may be reduced.

The etching gas composition may further include a second organofluorine compound and/or a third organofluorine compound that may be different from one another (e.g., have a different chemical structure and/or chemical formula).

Second Organofluorine Compound

The second organofluorine compound may be a C1 to C6 perfluorocarbon compound. Here, a perfluorocarbon compound may refer to a hydrogen-free organofluorine compound including only carbon (C) and fluorine (F). In some embodiments, the second organofluorine compound may include a perfluorocarbon compound including a conjugated double bond. In some embodiments, the second organofluorine compound may have a structure of $C_mF_n$, optionally wherein m may be an integer of 4 to 6, and n may be an even integer of 2m-2 or less.

In some embodiments, the second organofluorine compound may include tetrafluoromethane, tetrafluoroethene, hexafluoroethane, octafluoropropane, hexafluoropropene, octafluorobutene, hexafluorobutadiene, or decafluorocyclopentane. In some embodiments, the second organofluorine compound may be $C_4F_6$.

Third Organofluorine Compound

The third organofluorine compound may be a C1 to C4 fluorocarbon compound. In some embodiments, the third organofluorine compound may have a formula of $C_pH_qF_r$, optionally wherein p may be an integer of 1 to 4, each of q and r may be an integer of 1 or more, q+r may be an integer of 2p+2 or less, and r may be greater than or equal to q. In some embodiments, in the third organofluorine compound, r may be greater than or equal to 2q. In some embodiments, in the third organofluorine compound, r may be greater than or equal to 3q.

In some embodiments, the third organofluorine compound may include at least one selected from the group of $C_3H_4F_4$, $C_3H_3F_5$, $C_3H_2F_6$, $C_3H_1F_7$, $C_3H_3F_3$, $C_3H_2F_4$, $C_3H_1F_5$, $C_4H_4F_6$, $C_4H_3F_7$, $C_4H_2F_8$, $C_4H_1F_9$, $C_4H_4F_4$, $C_4H_3F_5$, $C_4H_2F_6$, $C_4H_1F_7$, $C_4H_2F_4$, and $C_4H_1F_5$. In some embodiments, the third organofluorine compound may be $CF_3$—CHF—$CHF_2$.

The first organofluorine compound may be contained in the etching gas composition in a predetermined ratio with the second organofluorine compound and the third organofluorine compound. In some embodiments, a total content of the second organofluorine compound and the third organofluorine compound may be in a range of about 1 part to about 60 parts by mole, based on 100 parts by mole of the first organofluorine compound.

In some embodiments, the total content of the second organofluorine compound and the third organofluorine compound may be in a range of about 5 parts to about 55 parts by mole, about 10 parts to about 55 parts by mole, about 10 parts to about 50 parts by mole, about 15 parts to about 50 parts by mole, about 20 parts to about 50 parts by mole, or in any range between the numerical values described above, based on 100 parts by mole of the first organofluorine compound.

When the total content of the second organofluorine compound and the third organofluorine compound is excessively low, an effect of improving surface roughness may be unsatisfactory. When the total content of the second organofluorine compound and the third organofluorine compound is excessively high, etch rate and etch selectivity may be reduced.

In addition, when the etching gas composition includes both the second organofluorine compound and the third organofluorine compound, a ratio B/C of a molar number B of the second organofluorine compound to a molar number C of the third organofluorine compound may be in a range of about 10 to about 32, about 12 to about 30, about 14 to about 28, about 16 to about 26, about 17 to about 24, about 18 to about 22, or in any range between the numerical values described above. When the ratio B/C is in the range described above, appropriate etch rate and etch selectivity may be obtained.

The etching gas composition may further include a carrier gas. The carrier gas may include an inert gas, such as helium (He), neon (Ne), and argon (Ar), a low reactive gas such as nitrogen, oxygen, or a mixture thereof.

The carrier gas may be contained at a content of about 5 parts to about 2000 parts by mole, based on 100 parts by mole of the first organofluorine compound. In some embodiments, a content of the carrier gas may be in a range of about 10 parts to about 1500 parts by mole, about 20 parts to about 1300 parts by mole, about 50 parts to about 1000 parts by mole, about 100 parts to about 800 parts by mole, about 150 parts to about 600 parts by mole, about 200 parts to about 400 parts by mole, or in any range between the numerical values described above, based on 100 parts by mole of the first organofluorine compound.

The etching gas composition described above may have an excellent etch selectivity of a silicon compound (e.g., silicon oxide and/or silicon nitride) with respect to an amorphous carbon layer (ACL). In particular, because etch selectivities of $Si_3N/SiO_2$, $SiO_2$/ACL, $SiO_2$/W, and $Si_3N_4$/ACL are excellent, the etch selectivities thereof may be effectively used to etch channel holes and form cell metal contacts (CMC).

Manufacture of Semiconductor Device

The etching gas composition described above may be applied to the formation of various patterns in the manufacture of a semiconductor device. For example, the pattern may include a hole pattern, a line-and-space pattern, a trench pattern, and various other arbitrary patterns, without being specifically limited thereto.

FIG. 1 is a schematic plan view of a semiconductor device 100 according to some embodiments of the inventive concept.

Referring to FIG. 1, the semiconductor device 100 may include a memory cell area MA and a connection area PA that is adjacent (e.g., surrounds) the memory cell area MA.

A plurality of memory devices are provided in the memory cell area MA and stacked in a vertical direction. The connection area PA may provide an electrical connection between the memory devices of the memory cell area MA and a controller.

Figure 2:
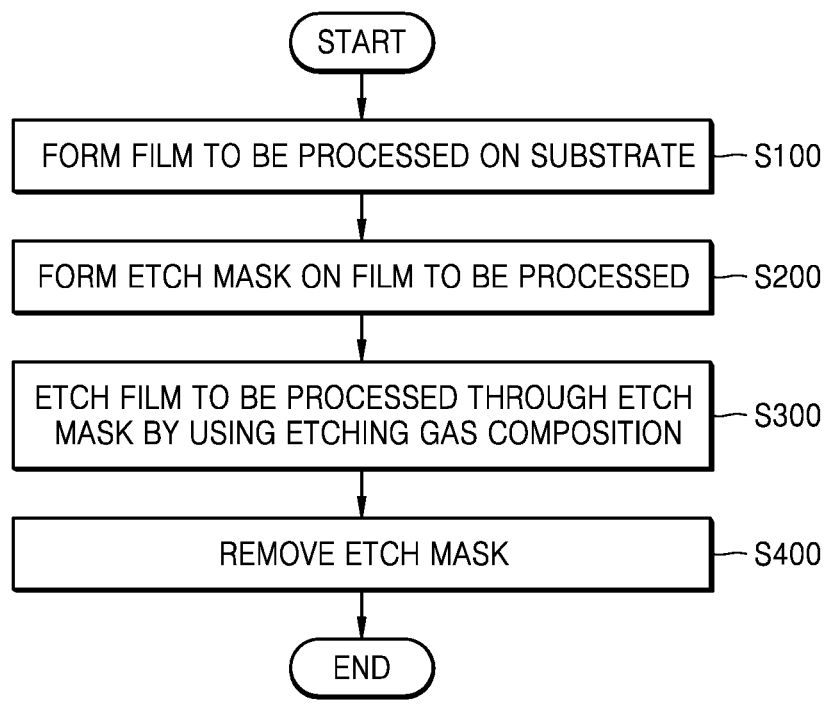
FIG. 2 is a flowchart of a method of manufacturing a semiconductor device, according to some embodiments of the inventive concept.

FIG. 2 is a flowchart of a method of manufacturing a semiconductor device according to some embodiments of the inventive concept. FIGS. 3A to 3F are side cross-sectional views illustrating a method of manufacturing a semiconductor device, according to some embodiments of the inventive concept. FIGS. 3A to 3F are side cross-sectional view of a memory cell area (e.g., MA in FIG. 1), FIGS. 3G to 3J are side cross-sectional views of a connection area (e.g., PA in FIG. 1) after operation shown in FIG. 3F, and FIG. 3K is a side cross-sectional view of the memory cell area MA after operation shown in FIG. 3J.

Figure 3A:
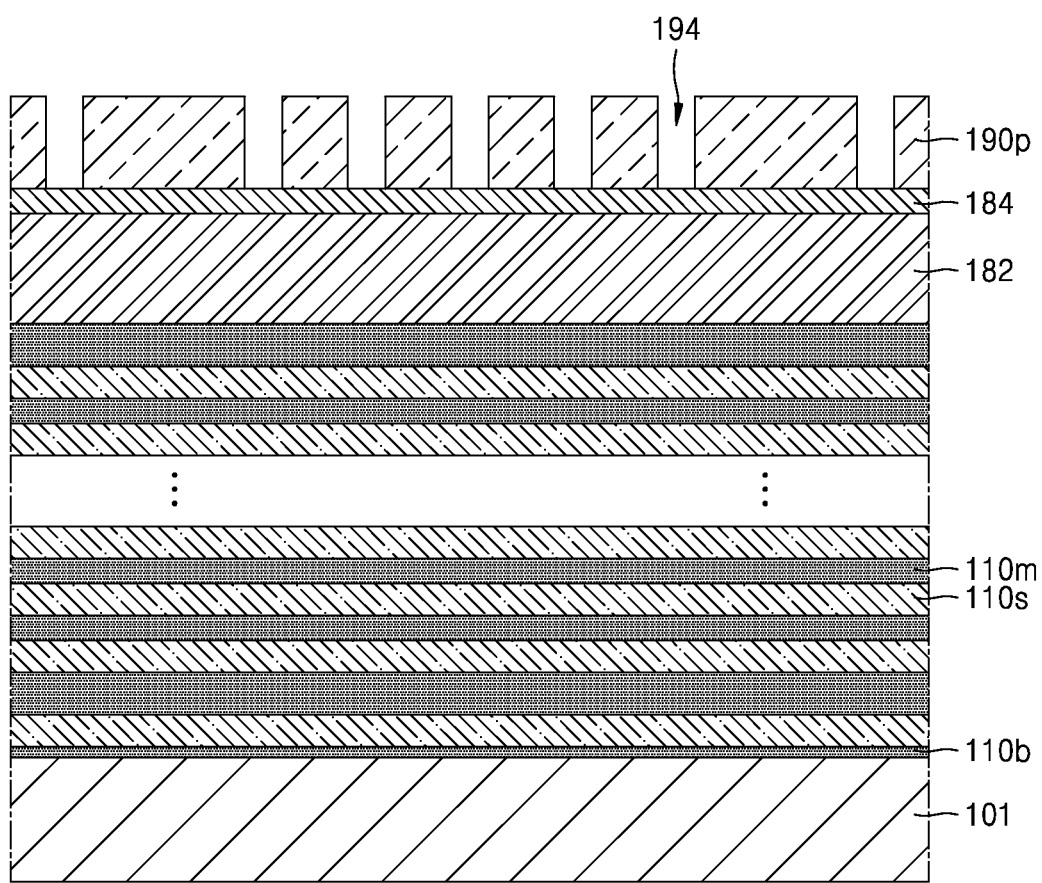
FIGS. 3A, 3B, 3C, 3D, 3E, 3F, 3G, 3H, 3I, 3J, and 3K are side cross-sectional views illustrating a method of manufacturing a semiconductor device, according to some embodiments of the inventive concept.

Referring to FIGS. 1, 2, and 3A, a sacrificial film 110s and an insulating film 110m may be alternately and repeatedly stacked as a film to be processed on a substrate 101 (S100).

The substrate 101 may include a semiconductor material, for example, a Group-IV semiconductor, a Group III-V compound semiconductor, or a Group II-VI oxide semiconductor. For example, the Group-IV semiconductor may include a single-crystalline silicon (Si), polycrystalline silicon, germanium (Ge), or silicon-germanium. The substrate 101 may be provided as a bulk wafer or an epitaxial layer. In some embodiments, the substrate 101 may include a silicon-on-insulator (SOI) substrate or a germanium-on-insulator (GeOI) substrate. In some embodiments, the substrate 101 may include a well of a first conductivity type (e.g., p type).

The sacrificial film 110s may be formed using a material having an etch selectivity with respect to the insulating film 110m. For example, the sacrificial film 110s may be selected to be removed with a high etch selectivity in an etching process using an etchant, as compared to the insulating film 110m. For example, the insulating film 110m may include a silicon oxide film or a silicon nitride film, the sacrificial film 110s may be selected from a silicon oxide film, a silicon nitride film, a silicon carbide, polysilicon (poly-Si), and silicon germanium so as to have a high etch selectivity with respect to the silicon insulating film 110m. For example, when the sacrificial film 110s includes silicon oxide, the insulating film 110m may include silicon nitride. As another example, when the sacrificial film 110s includes silicon nitride, the insulating film 110m may include silicon oxide. As yet another example, when the sacrificial film 110s includes undoped poly-Si, the insulating film 110m may include silicon nitride or silicon oxide.

The sacrificial film 110s and the insulating film 110m may be formed using, for example, a chemical vapor deposition (CVD) process, a physical vapor deposition (PVD) process, and/or an atomic layer deposition (ALD) process.

A thermal oxide film 110b may be provided between the substrate 101 and the sacrificial film 110s, which is formed closest to the substrate 101. The thermal oxide film 110b may have a smaller thickness than the insulating film 110m.

A hard mask material film 182, an anti-reflecting film 184, and a photoresist pattern 190p may be sequentially formed on the sacrificial film 110s and the insulating film 110m, which are alternately stacked.

The hard mask material film 182 may include an ACL, a spin-on hardmask (SOH), or other carbon-based materials having appropriate etch selectivities with respect to the sacrificial film 110s and the insulating film 110m, without being specifically limited. The hard mask material film 182 may have a thickness of about 1000 Å to 4000 Å.

The anti-reflecting film 184 may include silicon nitride, silicon oxynitride, amorphous silicon, titanium, titanium dioxide, titanium nitride, chromium oxide, carbon, an organic anti-reflective coating (ARC) material, or a combination thereof. The anti-reflecting film 184 may have a thickness of about 200 angstroms (Å) to about 400 Å.

The photoresist pattern 190p may include, for example, extreme ultraviolet (EUV) (13.5 nm) resist, krypton fluoride (KrF) excimer laser (248 nm) resist, argon fluoride (ArF) excimer laser (193 nm) resist, or fluorine ($F_2$) excimer laser (157 nm) resist. The photoresist pattern 190p may include a plurality of hole patterns 194 corresponding to a plurality of channel holes (e.g., 130h in FIG. 3C) to be formed in a memory cell area MA subsequently.

Figure 3B:
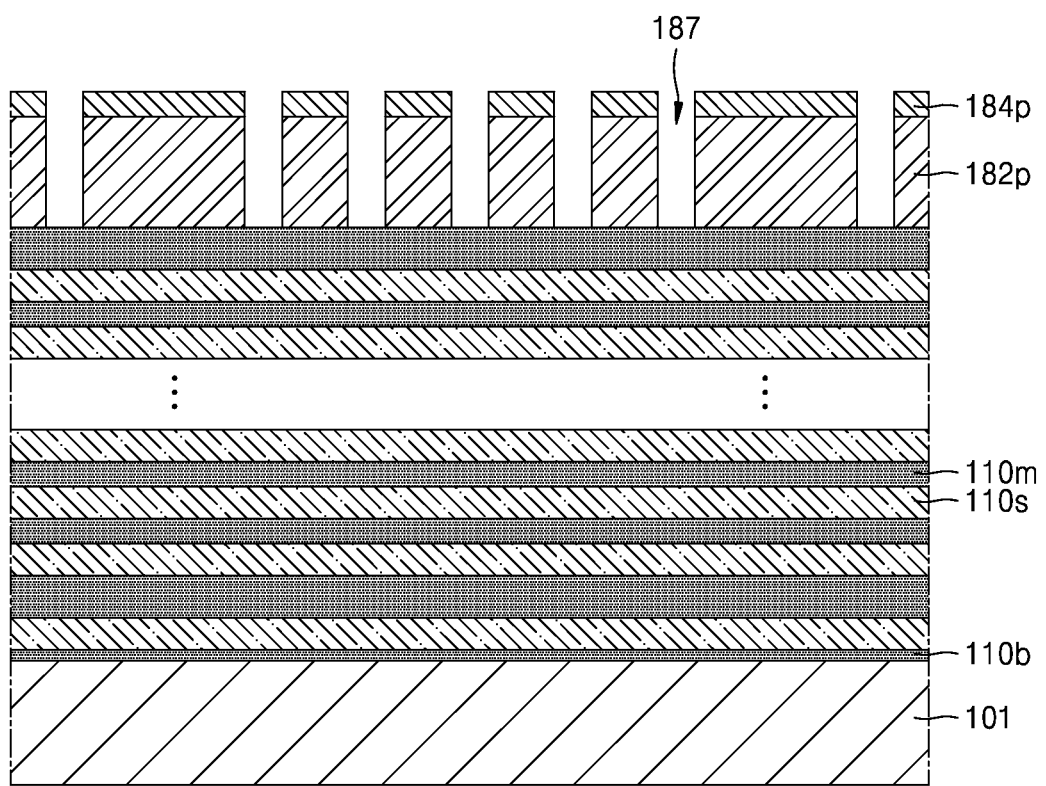

Referring to FIGS. 1, 2, and 3B, the anti-reflecting film 184 and the hard mask material film 182 may be etched using the photoresist pattern 190p as an etch mask, thereby forming a hard mask pattern 182p (S200). The etching process may be, for example, a dry anisotropic etching process.

The anti-reflecting film 184 and the hard mask material film 182 may be entirely removed using the etching process from a portion where the anti-reflecting film 184 is exposed by the hole patterns 194 of the photoresist pattern 190p, thereby exposing a top surface of the insulating film 110m.

In a portion where the photoresist pattern 190p is present, the anti-reflecting film 184 and the hard mask material film 182 may be protected by the photoresist pattern 190p and remain unetched. Although an anti-reflecting film pattern 184p is illustrated as remaining in FIG. 3B, the anti-reflecting film pattern 184p may be removed during a process of removing the photoresist pattern 190p or an additional process. The anti-reflecting film pattern 184p and the hard mask pattern 182p may define hole patterns 187.

Figure 3C:
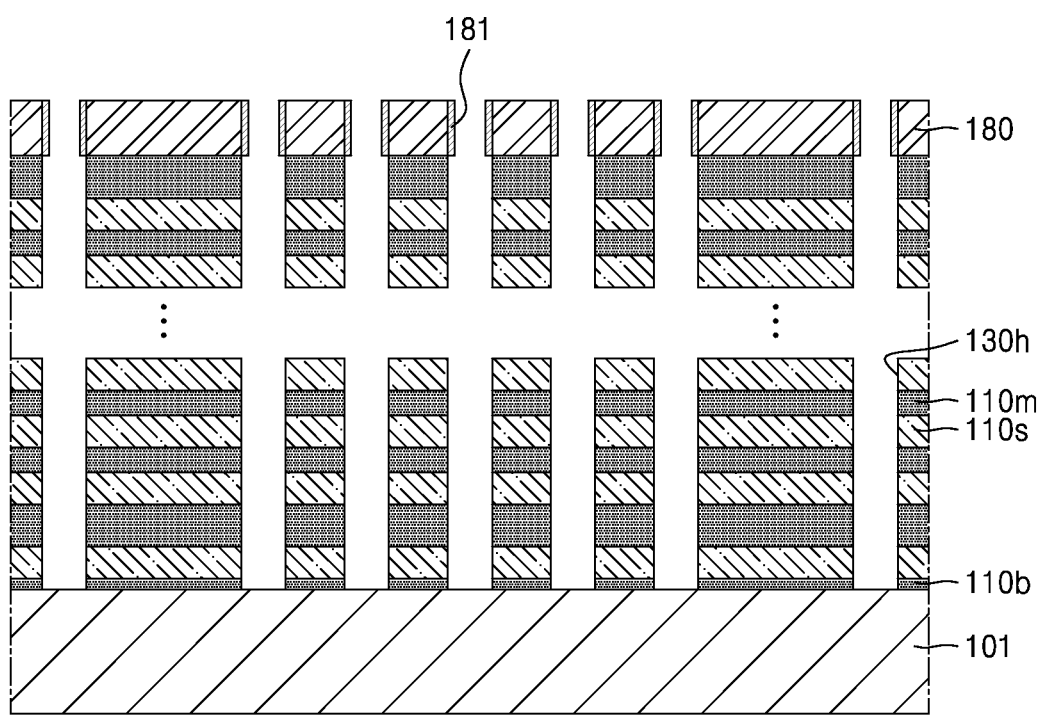

Referring to FIGS. 1, 2, and 3C, the channel holes 130h may be formed using the hard mask pattern 182p as an etch mask to pass through the sacrificial film 110s and the insulating film 110m (S300).

To form the channel holes 130h to pass through the sacrificial film 110s and the insulating film 110m, while supplying an etching gas composition and oxygen, power may be supplied, and an electrical bias may be applied. The etching gas composition may be converted into a plasma state due to the supplied power, and an anisotropic etching process may be performed due to the electrical bias. The etching gas composition may be an etching gas composition described above, according to some embodiments of the inventive concept.

An etching apparatus using plasma may include, for example, a reactive ion etching (RIE) equipment, a magnetically enhanced RIE (MERIE) equipment, an inductively coupled plasma (ICP) equipment, a transformer coupled plasma (TCP) equipment, a hollow-anode-type plasma equipment, a helical resonator plasma equipment, an electron cyclotron resonance (ECR) plasma equipment, etc. without being limited thereto.

During the anisotropic etching process using the etching gas composition in the plasma state, a passivation layer 181 may be formed on a side surface of the hard mask pattern 182p. The passivation layer 181 may include elemental sulfur (S). The elemental sulfur of the passivation layer 181 may be derived from an organosulfur compound of the etching gas composition.

In some embodiments, the passivation layer 181 may include a C—S bond. In some embodiments, the passivation layer 181 may include carbon sulfide (e.g., $CS_2$). Although the inventive concept is not limited by a specific theory, because the hard mask pattern 182p includes a carbon component, sulfur in the organosulfur compound may generate $CS_2$ according to the following reaction formula:

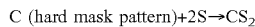

C (hard mask pattern)+2S→$CS_2$

An organosulfur composition included in the etching gas composition may include a C—S bond, and when a film to be processed (here, the sacrificial film 110s and the insulating film 110m) to be etched using plasma obtained from the etching gas composition, non-volatile radicals, such as CS*, $CS_2$*, S* and $S_2$* may be generated. The non-volatile radicals may undergo a reaction (e.g., a reaction expressed in the above-described reaction formula) on a surface of the hard mask pattern 182p including the carbon component or be deposited on the surface of the hard mask pattern 182p, thereby forming the passivation layer 181.

The anisotropic etching process may be performed at a temperature of, for example, about 250 K to about 420 K, about 260 K to about 400 K, about 270 K to about 380 K, about 280 K to about 360 K, or about 290 K to about 340 K. In particular, the reaction for forming the passivation layer 181 may be facilitated at a temperature of about 300 K or higher. Accordingly, the anisotropic etching process may be performed at a temperature of about 300 K or higher.

The C—S bond included in the passivation layer 181 may be confirmed using, for example, an optical emission spectroscopy (OES) analysis method and/or an X-ray photoelectron spectroscopy (XPS) analysis method. However, the inventive concept is not limited thereto.

The anisotropic etching process may be different from a deep RIE (DRIE) process (so-called, a BOSCH process) in that the anisotropic etching process is performed all at once throughout the entire thickness of the film to be processed and an isotropic etching process is not involved.

As described above, the formation of the passivation layer 181 may be performed simultaneously with the anisotropic etching process for forming the channel holes 130h. However, the inventive concept is not limited thereto, and the channel holes 130h may be formed after the passivation layer 181 is formed using the etching gas composition.

Figure 4A:
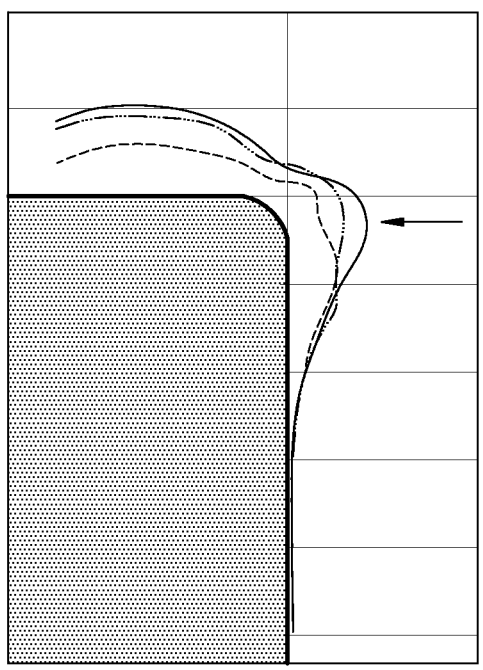
FIG. 4A shows a distribution of thicknesses of a passivation layer, which does not include a sulfur component, as a result of a formation process using an etching gas composition that does not include the sulfur component.
Figure 4B:
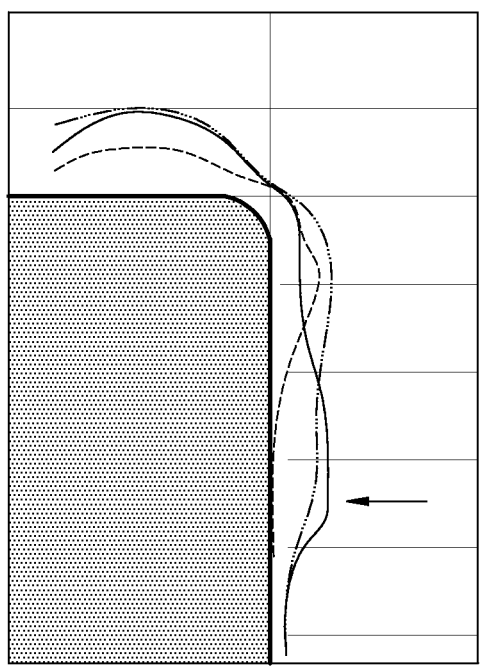
FIG. 4B shows a distribution of thicknesses of a passivation layer including a sulfur component, which is formed as a result of a process using an etching gas composition according to embodiments of the inventive concept.

By using the etching gas composition according to embodiments of the inventive concept, the conformality and surface roughness of the passivation layer 181 may be greatly improved. FIG. 4A shows a distribution of thicknesses of a passivation layer, which does not include a sulfur component, as a result of a formation process using an etching gas composition that does not include the sulfur component. FIG. 4B shows a distribution of thicknesses of a passivation layer including a sulfur component, which is formed as a result of a process using an etching gas composition according to embodiments.

Referring to FIG. 4A, as a result of an etching process using an etching gas composition that does not include a sulfur component, a laterally protruding profile is shown at a portion indicated by the arrow.

Referring to FIG. 4B, as a result of an etching process using an etching gas composition including a sulfur component, a profile with a significantly reduced degree of protrusion is shown (refer to a portion indicated by the arrow). That is, a horizontal thickness of the protrusion which the arrow indicates in FIG. 4B is significantly smaller than that in FIG. 4A.

Accordingly, when the etching gas composition according to embodiments of the inventive concept is used to etch a film to be etched through a mask pattern on which a passivation layer is formed, the surface roughness of a sidewall may be markedly reduced. Thus, the line edge roughness (LER) line and width roughness (LWR) of vertical patterns, such as contact holes or trenches, may be greatly improved. Therefore, high-aspect-ratio contacts (HARCs) of good quality, which have reduced bowing or tapering, may be formed.

Figure 3D:
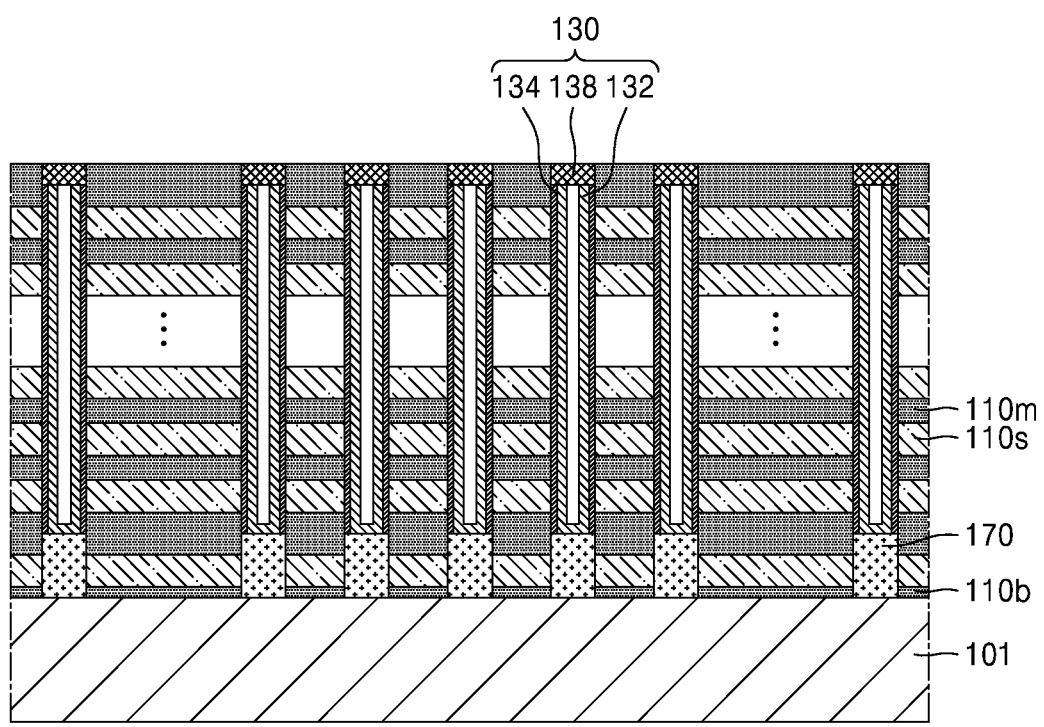

Referring to FIGS. 1, 2, and 3D, a semiconductor pattern 170 may be formed to have a predetermined height inside the channel hole 130h.

The semiconductor pattern 170 may be formed by a selective epitaxial growth (SEG) process using an exposed top surface of the substrate 101 as a seed. Accordingly, the semiconductor pattern 170 may be formed to include single-crystalline silicon depending on a material of the substrate 101 and, in some embodiments, the semiconductor pattern 170 may be doped with impurities when necessary. In other embodiments, the formation of the semiconductor pattern 170 may include forming an amorphous silicon film to fill the channel hole 130h to have a predetermined height and performing a laser epitaxial growth (LEG) process or a solid phase epitaxy (SPE) process on the amorphous silicon film.

Subsequently, a vertical channel structure 130 may be formed inside the channel hole 130h.

The vertical channel structure 130 may include an information storage pattern 134, a vertical channel pattern 132, and a buried insulating pattern 138. The information storage pattern 134 may be between a sacrificial film 110s and the vertical channel pattern 132. In some embodiments, the information storage pattern 134 may be provided in the form of a tube having openings at the top and bottom thereof. The information storage pattern 134 may be provided to expose an upper surface of the semiconductor pattern 170. In some embodiments, the information storage pattern 134 may include a film capable of storing data using Fowler-Nordheim tunneling effects. In other embodiments, the information storage pattern 134 may include a thin film capable of storing data based on a different operation principle.

In some embodiments, the information storage pattern 134 may include a plurality of thin films. For example, the information storage pattern 134 may include the plurality of thin films, such as a blocking insulating film, a charge storage film, and a tunnel insulating film. The vertical channel pattern 132 may be formed to conformally cover a side surface of the information storage pattern 134 and the exposed upper surface of the semiconductor pattern 170. The vertical channel pattern 132 may be directly connected to the semiconductor pattern 170. The vertical channel pattern 132 may include a semiconductor material (e.g., a polycrystalline silicon film, a single-crystalline silicon film, or an amorphous silicon film). In some embodiments, the vertical channel pattern 132 may be formed using an ALD process or a CVD process.

The buried insulating pattern 138 may be formed to fill the remaining portion of the channel hole 130H, which is not filled by the information storage pattern 134 and the vertical channel pattern 132. The buried insulating pattern 138 may include a silicon oxide film or a silicon nitride film. In some embodiments, before the buried insulating pattern 138 is formed, a hydrogen annealing process may be further performed to cure crystal defects that may be present in the vertical channel pattern 132.

Figure 3E:
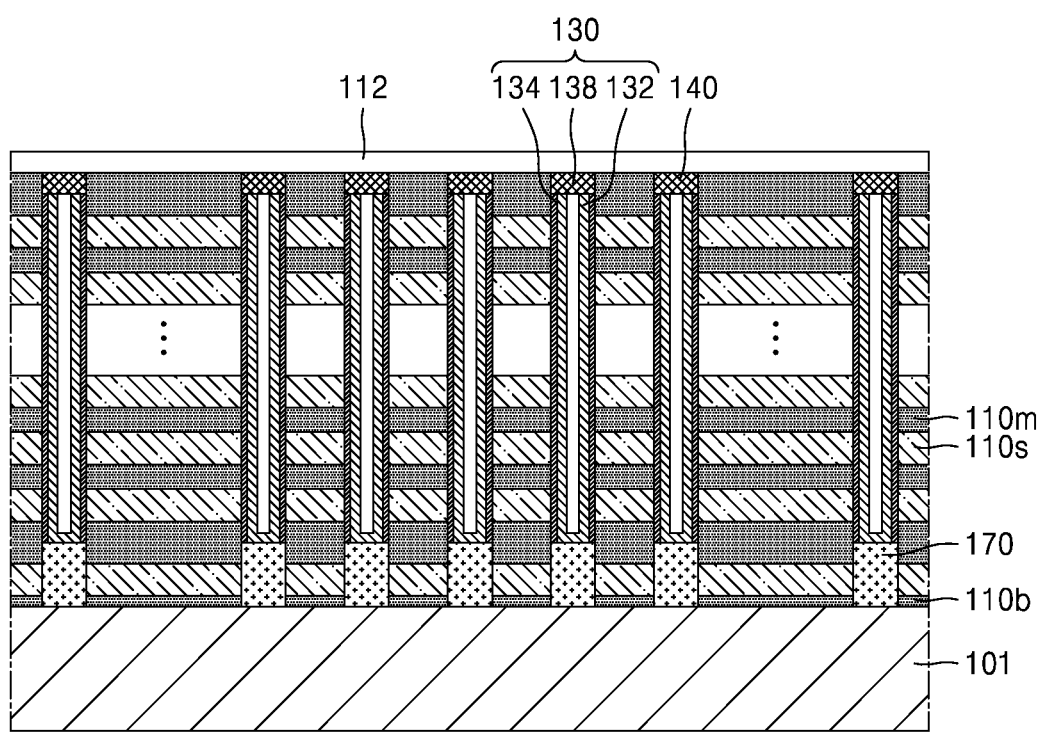
Figure 3F:
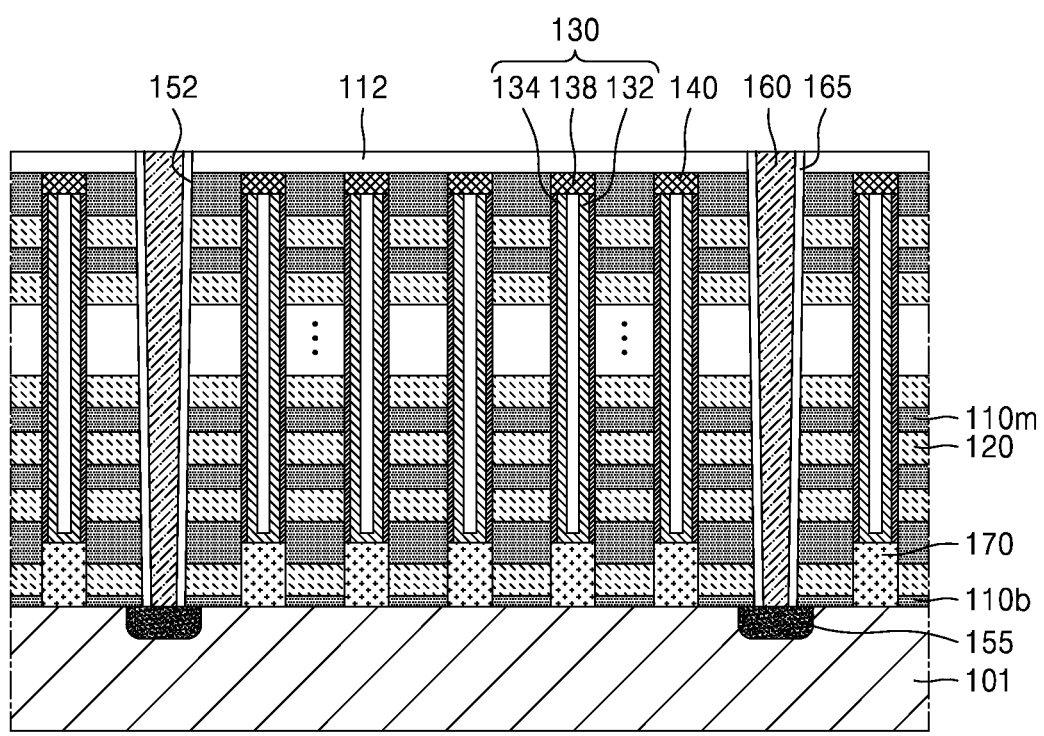

Referring to FIGS. 1, 2, and 3E, a conductive pad 140 may be formed on each of the vertical channel structures 130.

In some embodiments, to form the conductive pad 140, an upper portion of the vertical channel structure 130 may be recessed, and a conductive material may be buried in the recessed portion. In some embodiments, impurities may be implanted into the upper portion of the vertical channel structure 130, thereby forming the conductive pad 140.

Subsequently, a cap insulating layer 112 may be formed on the conductive pad 140 and an insulating film 110m, which is at an uppermost layer. For example, the cap insulating layer 112 may include a silicon oxide film or a silicon nitride film and be formed using a CVD process or an ALD process.

Referring to FIGS. 1, 2, and 3F, a word line cut trench 152 may be formed in a portion of a memory cell area MA to extend to an upper surface of the substrate 101. A common source line 155 may be formed by implanting impurities into the substrate 101 through the word line cut trench 152. The impurities may have a conductivity type opposite to that of a portion of the substrate 101 in which the common source line 155 is formed, or a well.

Thereafter, the sacrificial film 110s may be replaced by a gate electrode through the word line cut trench 152.

To this end, to begin with, the sacrificial film 110s may be removed through the word line cut trench 152. As described above with reference to FIGS. 2 and 3A, because the sacrificial film 110s is selected to have a high etch selectivity with respect to the insulating film 110m, the sacrificial film 110s may be selectively removed by selecting an appropriate etchant.

Thereafter, a barrier film and a gate electrode material film may be sequentially formed to fill a space from which the sacrificial film 110s is removed. The barrier film may be formed of a material, such as titanium nitride (TiN) and tantalum nitride (TaN), using a CVD process or an ALD process to have a thickness of about 30 Å to about 150 Å.

The gate electrode material film may be formed using a metal, such as tungsten (W), copper (Cu), aluminum (Al), platinum (Pt), titanium (Ti), and tantalum (Ta), a conductive metal nitride, such as a metal silicide, titanium nitride (TiN), and tantalum nitride (TaN), poly-Si, or amorphous silicon, and be doped with impurities as needed. The gate electrode material film may be formed to fill the remaining space after the barrier film is formed. Subsequently, the gate electrode material film inside the word line cut trench may be patterned to form a gate electrode 120.

Next, an isolation insulating film 165 and a conductive film 160 may be sequentially formed inside the word line cut trench 152.

The isolation insulating film 165 may include, for example, any one of a silicon nitride film, a silicon oxide film, or a silicon oxynitride film and be formed using a CVD process or an ALD process. For example, the conductive film 160 may include a metal, such as tungsten or copper, and be formed using a CVD process or an ALD process.

Figure 3G:
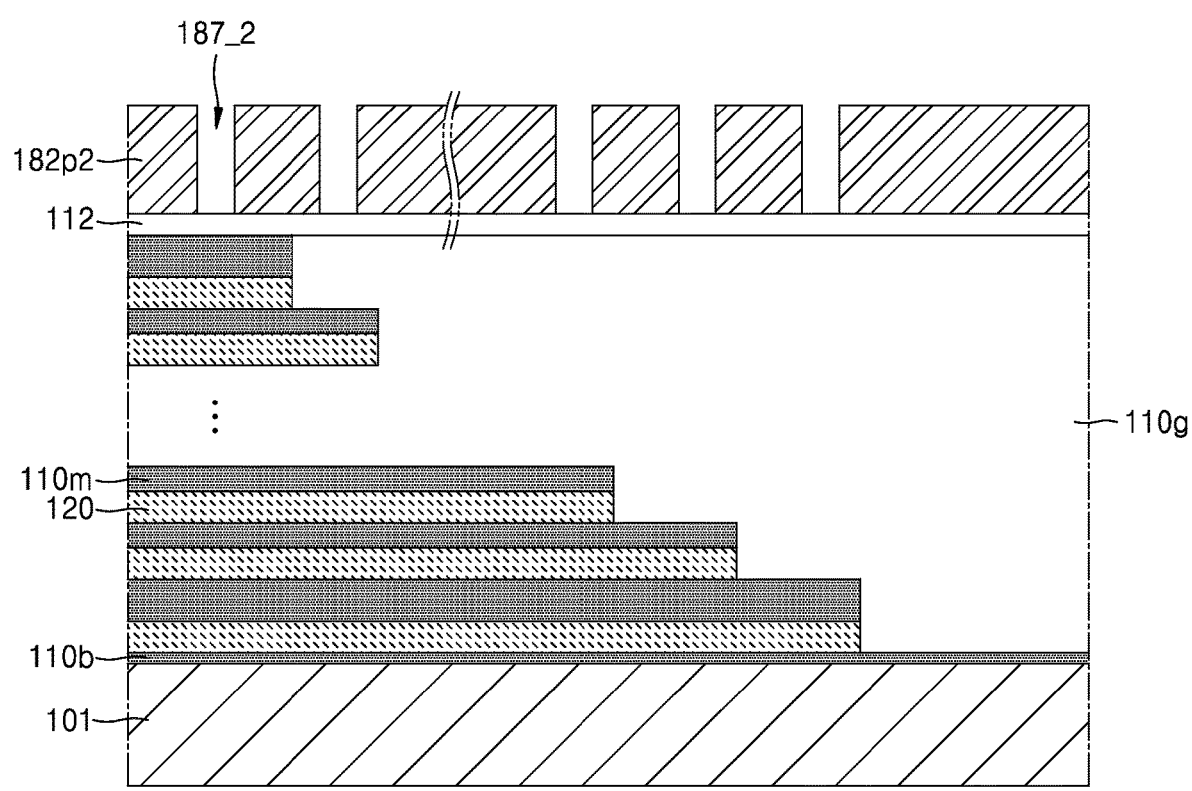

Referring to FIGS. 1, 2, and 3G, a plurality of pairs of gate electrodes 120 and insulating films 110m corresponding thereto may be stacked on each other in a connection area PA such that distal parts thereof are provided in a staircase form. In addition, an interlayer insulating film 110g may be between the distal parts provided in the staircase form and the cap insulating film 112. The interlayer insulating film 110g may include, for example, silicon oxide and be formed using a CVD process.

An etching mask pattern 182p2 may be provided on the cap insulating film 112. The etching mask pattern 182p2 may include a photoresist pattern or include a hard mask pattern. In some embodiments, a material for the etching mask pattern 182p2 may be the same as the material for the hard mask pattern 182p described with reference to FIG. 3B.

The etching mask pattern 182p2 may include hole patterns 187_2 corresponding to contact holes to be formed subsequently.

Figure 3H:
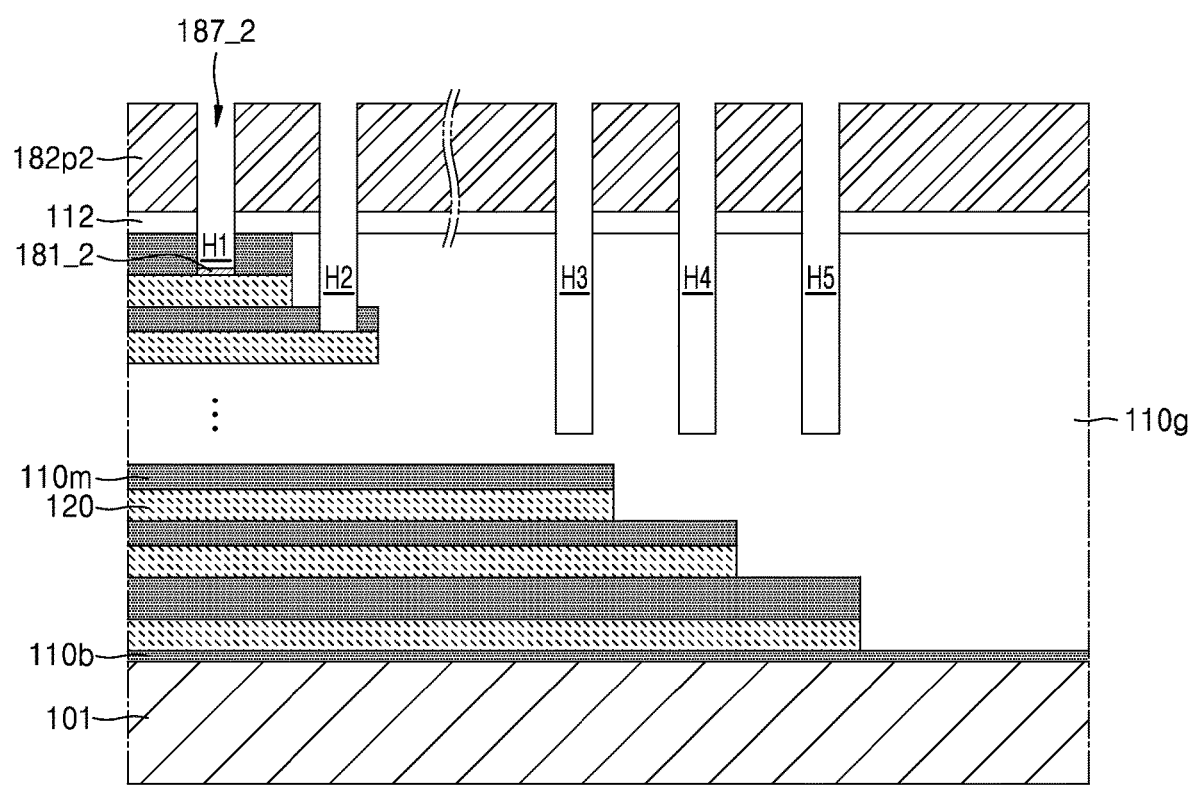

Referring to FIGS. 1, 2, and 3H, the cap insulating film 112 and the interlayer insulating film 110g may be etched using the etching mask pattern 182p2. FIG. 3H illustrates an example in which only a portion of the interlayer insulating film 110g is etched. That is, FIG. 3H shows a state in which the etching of the interlayer insulating film 110g is not completed.

The etching gas composition used for the etching process may be the etching gas composition according to embodiments of the inventive concept described above. However, the etching gas composition used in the present operation may include the same composition as or a different composition from the etching gas composition used to form the channel hole 130h (e.g., 130h in FIG. 3C).

In some embodiments, an organofluorine compound of the etching gas composition used in the present operation may be different from the organofluorine compound used to form the channel hole 130h. In other embodiments the organofluorine compound of the etching gas composition used in the present operation may be the same as an organofluorine compound used to form the channel hole 130h.

In some embodiments, an organosulfur compound of the etching gas composition used in the present operation may be different from an organosulfur compound used to form the channel hole 130h. In other embodiments, the organosulfur compound of the etching gas composition used in the present operation may be the same as the organosulfur compound used to form the channel hole 130h.

From among first to fifth holes H1 to H5, each of the third to fifth holes H3 to H5 may not reach the insulating film 110m corresponding thereto. Thus, the etching process may not be completed yet. The second hole H2 may pass through the insulating film 110m corresponding thereto. Thus, an upper surface of the gate electrode 120 corresponding to the second hole H2 may be exposed. The first hole H1 may not only pass through the insulating film 110m corresponding thereto, but also a predetermined time may elapse after the upper surface of the gate electrode 120 is exposed.

In particular, a passivation layer 181_2 may be provided on a bottom surface of the first hole H1, that is, the exposed upper surface of the gate electrode 120. The passivation layer 1812 may include a C—S bond. In some embodiments, the passivation layer 181_2 may include carbon sulfide (e.g., $CS_2$). Although the inventive concept is not limited by a specific theory, because the etching gas composition includes a carbon component, sulfur in the organosulfur compound may generate $CS_2$ according to the following reaction formula and be deposited in the passivation layer 181_2.

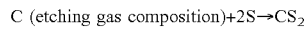

An organosulfur composition included in the etching gas composition may include a C—S bond, and when a film to be processed (here, the interlayer insulating film 110g and the insulating film 110m) to be etched using plasma obtained from the etching gas composition, non-volatile radicals, such as CS*, $CS_2$*, S*, and $S_2$*, may be generated. The non-volatile radicals may undergo a reaction (e.g., a reaction expressed in the above-described reaction formula) on a surface of the gate electrode 120 including a metal component (e.g., tungsten (W)) or may be deposited on the surface of the gate electrode 120, thereby forming the passivation layer 181_2.

In some embodiments, the passivation layer 181_2 may include substantially the same component as the passivation layer 181 described with reference to FIG. 3C.

The reaction for forming the passivation layer 181_2 may be facilitated at a temperature of about 300 K or higher. Accordingly, the anisotropic etching process may be performed at a temperature of about 300 K or higher.

The C—S bond included in the passivation layer 181_2 may be confirmed using, for example, an OES analysis method and/or an XPS analysis method. However, the inventive concept is not limited thereto.

The second hole H2 may be obtained immediately after the upper surface of the gate electrode 120 corresponding thereto is exposed. The passivation layer may be further formed on the exposed upper surface of the gate electrode 120 while the third to fifth holes H3 to H5 are being additionally etched and extended.

Figure 3I:
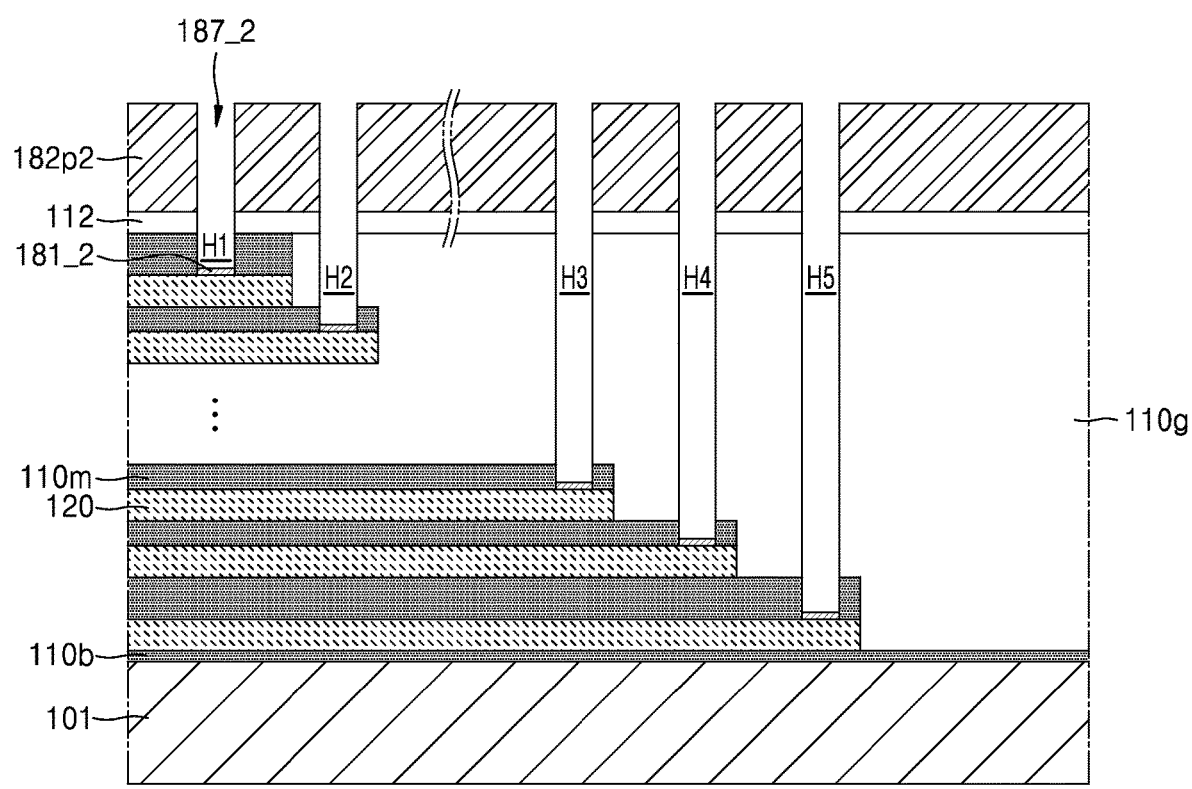

Referring to FIGS. 1, 2, and 3I, the formation of the third to fifth holes H3 to H5 may be completed due to the additional etching process, and each of the first to fifth holes H1 to H5 may be connected to the upper surface of the gate electrode 120 corresponding thereto.

In addition, by forming the first to fifth holes H1 to H5 using the etching gas composition, the passivation layer 181_2 may be formed on the upper surface of the gate electrode 120, which is exposed due to the etching process. The passivation layer 181_2 may contribute toward reducing contact resistance by reducing the roughness of the upper surface of the gate electrode 120, which is exposed when the first to fifth holes H1 to H5 are formed.

Figure 3J:
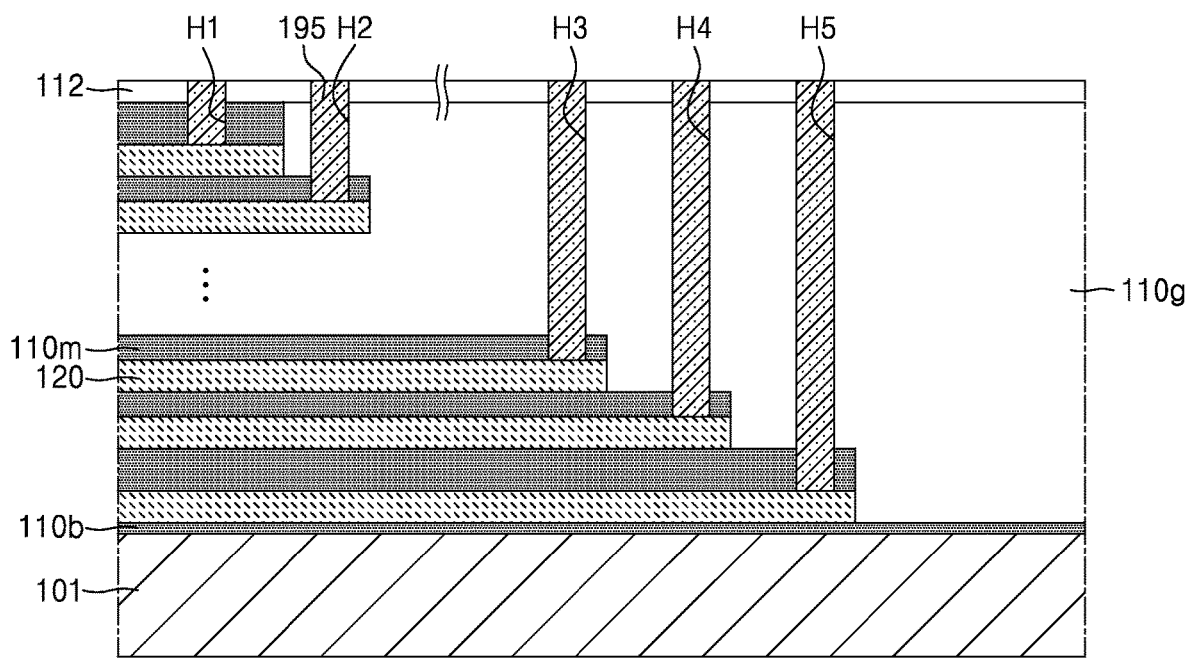
Figure 3K:
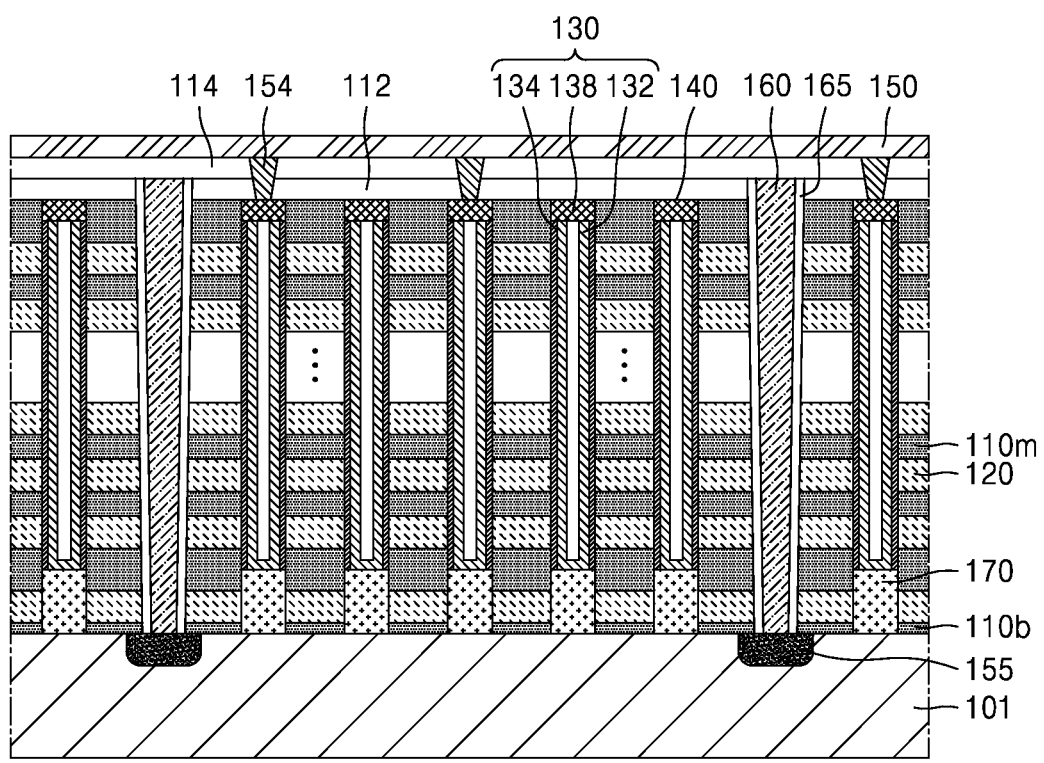

Referring to FIGS. 1, 2, and 3J, the passivation layer 181_2 may be removed, and contact plugs 195 may be formed inside the first to fifth holes H1 to H5.

For example, the passivation layer 181_2 may be removed using a wet etching process, which may be performed using, for example, a phosphoric acid aqueous solution or sulfuric acid aqueous solution having an appropriate concentration.

Subsequently, the contact plugs 195 may be respectively formed inside the first to fifth holes H1 to H5. The contact plugs 195 may include a metal, such as tungsten, titanium, tantalum, copper, or aluminum, a conductive metal nitride, such as titanium nitride (TiN) or tantalum nitride (TaN), or a conductive material, such as doped silicon.

The formation of the contact plugs 195 may include forming a conductive layer using a CVD process, a PVD process, or an ALD process to fill the first to fifth holes H1 to H5 and to cover a top surface of the cap insulating layer 112 and partially removing the conductive layer such that the conductive layer is defined in the first to fifth holes H1 to H5. The partial removal of the conductive layer may be performed using an etchback process or a chemical mechanical polishing (CMP) process.

Referring to FIGS. 1, 2, and 3K, an upper interlayer insulating film 114 may be formed on the cap insulating layer 112 in the memory cell area MA, and a bit line contact plug 154 and a bit line 150 may be then formed.

The upper interlayer insulating film 114 may include any one of a silicon nitride film, a silicon oxide film, or a silicon oxynitride film and be formed using a CVD process or an ALD process. Thereafter, a contact hole for forming the bit line contact plug 154 may be formed to pass through the upper interlayer insulating film 114 and the cap insulating layer 112, and the bit line contact plug 154 may be formed of a conductive material inside the contact hole. The bit line contact plug 154 may include a metal, such as tungsten, titanium, tantalum, copper, or aluminum, a conductive metal nitride, such as TiN or TaN, or a conductive material, such as doped silicon. The formation of the bit line contact plug 154 may include forming a conductive material film using a CVD process, a PVD process, or an ALD process to completely fill the contact hole and performing a planarization process to expose an upper surface of the upper interlayer insulating film 114.

Thereafter, the bit line 150 may be formed to be electrically connected to the bit line contact plug 154. Like the bit line contact plug 154, the bit line 150 may also include a metal, such as tungsten, titanium, tantalum, copper, or aluminum, a conductive metal nitride, such as TiN or TaN, or a conductive material, such as doped silicon.

Hereinafter, configurations and effects according to the inventive concept will be described in further detail with reference to specific Experimental examples and a Comparative example. However, these Experimental examples are provided merely for clarity of explanation and are not intended to limit the scope of the inventive concept.

Examples 1 to 6 and Comparative Examples 1 to 6

Etch rates of respective films to be processed were measured under conditions shown in Table 1 below by using etching gas compositions having compositions shown in Table 1, and measurement results are provided in Table 2.

In Examples 1 to 6, hexafluoro-2,5-dihydrothiophene was used as a first gas, and 1,1,1,4,4,4-hexafluoro-2-butene was used as a second gas. In Comparative examples 1 to 6, hexafluorobuta-1,3-diene was used as a first gas, and difluoromethane was used as a second gas. An etching process was performed via an MERIE method by using Applied Materials P5000 Equipment.

TABLE 1

|  | 1$^{st}$ gas | 2$^{nd}$ gas | O$_2$ | Ar | Power | T | time |
|---|---|---|---|---|---|---|---|
|  | sccm |  |  |  | W | K | sec |
| Example 1 | 15 | 5 | 26 | 15 | 500 | 305 | 20 |
| Example 2 | 15 | 5 | 31 | 15 | 500 | 305 | 20 |
| Example 3 | 15 | 5 | 36 | 15 | 500 | 305 | 20 |
| Example 4 | 15 | 5 | 41 | 15 | 500 | 305 | 20 |
| Example 5 | 15 | 5 | 46 | 15 | 500 | 305 | 20 |
| Example 6 | 15 | 5 | 51 | 15 | 500 | 305 | 20 |
| Comparative Example 1 | 15 | 5 | 26 | 15 | 500 | 305 | 20 |
| Comparative Example 2 | 15 | 5 | 31 | 15 | 500 | 305 | 20 |
| Comparative Example 3 | 15 | 5 | 36 | 15 | 500 | 305 | 20 |
| Comparative Example 4 | 15 | 5 | 41 | 15 | 500 | 305 | 20 |
| Comparative Example 5 | 15 | 5 | 46 | 15 | 500 | 305 | 20 |
| Comparative Example 6 | 15 | 5 | 51 | 15 | 500 | 305 | 20 |

TABLE 2

|  | $SiO_2$ | $Si_3N_4$ | ACL | W | poly-Si | selectivity | | | | | |
|---|---|---|---|---|---|---|---|---|---|---|---|
|  | (Å/min) | | | | | $SiO_2$/ACL | $Si_3N_4$/ACL | poly-Si/ACL | W/ACL | $SiO_2$/W | $Si_3N_4$/W |
| Example 1 | 1161 | 1020 | 300 | 144 | 228 | 3.87 | 3.40 | 0.76 | 0.48 | 8.06 | 7.08 |
| Example 2 | 1251 | 1080 | 456 | 261 | 393 | 2.74 | 2.37 | 0.86 | 0.57 | 4.79 | 4.14 |
| Example 3 | 1251 | 1086 | 480 | 324 | 459 | 2.61 | 2.26 | 0.96 | 0.68 | 3.86 | 3.35 |
| Example 4 | 1248 | 1074 | 522 | 390 | 483 | 2.39 | 2.06 | 0.93 | 0.75 | 3.20 | 2.75 |
| Example 5 | 1248 | 1107 | 558 | 453 | 504 | 2.24 | 1.98 | 0.90 | 0.81 | 2.75 | 2.44 |
| Example 6 | 1248 | 1122 | 582 | 528 | 543 | 2.14 | 1.93 | 0.93 | 0.91 | 2.36 | 2.13 |
| Comparative Example 1 | 1272 | 1128 | 396 | 345 | 189 | 3.21 | 2.85 | 0.48 | 0.87 | 3.69 | 3.27 |
| Comparative Example 2 | 1305 | 1242 | 684 | 438 | 261 | 1.91 | 1.82 | 0.38 | 0.64 | 2.98 | 2.84 |
| Comparative Example 3 | 1329 | 1536 | 981 | 498 | 306 | 1.35 | 1.57 | 0.31 | 0.51 | 2.67 | 3.08 |
| Comparative Example 4 | 1347 | 1626 | 1224 | 546 | 336 | 1.10 | 1.33 | 0.27 | 0.45 | 2.47 | 2.98 |
| Comparative Example 5 | 1368 | 1758 | 1320 | 612 | 372 | 1.04 | 1.33 | 0.28 | 0.46 | 2.24 | 2.87 |
| Comparative Example 6 | 1386 | 1859 | 1416 | 684 | 423 | 0.98 | 1.31 | 0.30 | 0.48 | 2.03 | 2.72 |

As shown in Table 2, it was confirmed that etch rates of ACLs in Comparative examples 1 to 6 were much higher than etch rates of ACLs in Examples 1 to 6. Accordingly, it can be inferred that etching gas compositions according to Examples 1 to 6 are advantageous when the ACL is used as a hard mask. Furthermore, it was confirmed that etch rates of tungsten (W) in Comparative examples 1 to 6 were much higher than etch rates of tungsten in Examples 1 to 6. Accordingly, it can be inferred that the etching gas compositions according to Examples 1 to 6 are advantageous when tungsten is used as a gate electrode in a connection area during the manufacturing of a vertical semiconductor memory device.

In the etching gas compositions according to Examples 1 to 6, it was confirmed that selectivities of silicon nitride and silicon oxide with respect to the ACL were maintained relatively high even when a supplied amount of oxygen was changed. In contrast, it was confirmed that the etching gas compositions according to Comparative examples 1 to 6 had relatively good selectivities when a supplied amount of oxygen was low, while the selectivities of the etching gas compositions according to Comparative examples 1 to 6 deteriorated rapidly as the supplied amount of oxygen increased.

Examples 7 and 8

Each film to be processed was etched in the same manner as in Examples 1 to 6 except that a supply rate of oxygen was changed to about 21 sccm and about 61 sccm.

Comparative Examples 7 and 8

Each film to be processed was etched in the same manner as in Comparative examples 1 to 6 except that a supply rate of oxygen was changed to about 21 sccm and about 61 sccm.

Roughnesses Rq of surfaces of an ACL, tungsten, and poly-Si, which were etched using recipes according to Examples 2, 4, 6, 7, and 8 and Comparative examples 2, 4, 6, 7, and 8, were measured, and measurement results are summarized with reference to FIG. 3. The roughnesses Rq were measured by atomic force microscope (AFM).

TABLE 3

|  | $1^{st}$ gas | $2^{nd}$ gas | $O_2$ | Ar | Power | T | time | ACL | W | poly-Si |
|---|---|---|---|---|---|---|---|---|---|---|
|  | sccm | | | | W | K | sec | | | |
| Bare substrate | — | — | — | — | — | — | — | 0.688 | 6.53 | 14.1 |
| Example 7 | 15 | 5 | 21 | 15 | 500 | 305 | 20 | 1.22 | 6.06 | — |
| Example 2 | 15 | 5 | 31 | 15 | 500 | 305 | 20 | 0.849 | 5.53 | 13.4 |
| Example 4 | 15 | 5 | 41 | 15 | 500 | 305 | 20 | 0.863 | 5.33 | 12.4 |
| Example 6 | 15 | 5 | 51 | 15 | 500 | 305 | 20 | 1.17 | 5.21 | 13.2 |
| Example 8 | 15 | 5 | 61 | 15 | 500 | 305 | 20 | 1.22 | 5.16 | 13.3 |
| Comparative Example 7 | 15 | 5 | 21 | 15 | 500 | 305 | 20 | 0.926 | 6.24 | — |
| Comparative Example 2 | 15 | 5 | 31 | 15 | 500 | 305 | 20 | 1.18 | 5.85 | 13.3 |
| Comparative Example 4 | 15 | 5 | 41 | 15 | 500 | 305 | 20 | 2.85 | 5.55 | 14.2 |
| Comparative Example 6 | 15 | 5 | 51 | 15 | 500 | 305 | 20 | 4.99 | 5.34 | 13.1 |
| Comparative Example 8 | 15 | 5 | 61 | 15 | 500 | 305 | 20 | 5.53 | 5.27 | 13.3 |

Referring to FIG. 3, it was observed that surface roughnesses of ACLs according to Examples were much lower than those of ACLs according to Comparative examples. Accordingly, when the ACL is used as the hard mask, the use of the etching gas compositions according to Examples may lead to a remarkable reduction in the surface roughness of a sidewall of, for instance, vertical patterns. Therefore, the LERs and LWRs of the vertical patterns, such as contact holes or trenches, may be greatly improved In addition, it was confirmed that surface roughnesses of tungsten and poly-Si according to Examples were generally lower than those of tungsten and poly-Si according to Comparative examples. When the roughnesses of etched surfaces of tungsten and poly-Si are reduced as described, contact resistances between the etched surfaces of tungsten and poly-Si and contact plugs to be formed thereon may be reduced, and thus, excellent electrical properties may be ensured.

The term "and/or" includes any and all combinations of one or more of the associated listed items. As used herein, an element or region that is "covering" or "surrounding" or "filling" another element or region may completely or partially cover or surround or fill the other element or region.

While the inventive concept has been particularly shown and described with reference to example embodiments thereof, it will be understood that various changes in form and details may be made therein without departing from the scope of the inventive concept.

What is claimed is:

1. An etching gas composition comprising:
   a first organofluorine compound having a formula of $C_aF_bH_c$, wherein a is an integer of 3 to 6, b is an integer of 1 to 10, and c is an integer of 1 to 6;
   an organosulfur compound having 1 to 4 sulfur atoms, the organosulfur compound comprising a carbon-fluorine (C—F) bond, a carbon-sulfur (C—S) bond and at least one carbon-carbon double (—C=C—) bond, and
   a second organofluorine compound and a third organofluorine compound, wherein the second and third organofluorine compound are each different from the first organofluorine compound,
   wherein the organosulfur compound is present in the etching gas composition in an amount of about 1 part to about 100 parts by mole based on 100 parts by mole of the first organofluorine compound,
   wherein the second organofluorine compound comprises a C1 to C6 perfluorocarbon compound, and the third organofluorine compound include at least one selected from the group of $C_3H_4F_4$, $C_3H_3F_5$, $C_3H_2F_6$, $C_3H_1F_7$, $C_3H_3F_3$, $C_3H_2F_4$, $C_3H_1F_5$, $C_4H_4F_6$, $C_4H_3F_7$, $C_4H_2F_8$, $C_4H_1F_9$, $C_4H_4F_4$, $C_4H_3F_5$, $C_4H_2F_6$, $C_4H_1F_7$, $C_4H_2F_4$, and $C_4H_1F_5$.

2. The etching gas composition of claim 1, wherein the organosulfur compound has a formula of $C_xF_yS_z$, wherein x is an integer of 1 to 6, y is an integer of 1 to 16, and z is an integer of 1 to 4.

3. The etching gas composition of claim 1, wherein
   the organosulfur compound comprises at least one selected from the group consisting of methanethioyl fluoride, difluoromethanethione, trifluormethanthiylradical, trifluoro(trifluoromethyl)sulfur(IV), pentafluoro(trifluoromethyl)-λ⁶-sulfane, trifluoromethylmercaptothiocarbonyl fluoride, 2,2,4,4-tetrafluoro-1,3-dithietane, trifluoro(trifluoromethylsulfanyl)methane, trifluoro-(trifluoromethyldisulfanyl)methane, trifluoro-(trifluoromethyltrisulfanyl)methane, trifluoro-(trifluoromethyltetrasulfanyl) methane, difluorobis(trifluoromethyl)sulfur(IV), 1,1,2-trifluoro-2-pentafluorosulfanylethene, bis(trifluoromethyl) tetrafluorosulfur(VI), pentafluoro(1,1,2,2,2-pentafluoroethyl)-λ⁶-sulfane, hexafluorothioacetone, bis(trifluoromethylsulfanyl) methanethione, 3,3,3-trifluoro-1-pentafluorosulfanyl-1-propyne, hexadecafluoro-octahydro-1,4-dithiane, 3,3,3-trifluoro-2-(trifluoromethyl)prop-1-ene-1-thione, 3,4-bis(trifluoromethyl)dithiete, bis(trifluoromethylmercapto) acetylene, perfluorotetrahydrothiophene, 2,2-difluoro-3,3-bis(trifluoromethyl)thiirane, and perfluorocyclohexanesulfurpentafluoride.

4. The etching gas composition of claim 1, wherein the first organofluorine compound comprises at least one selected from the group consisting of 1h-heptafluoropropane, 1,1,1,2,3,3,3-heptafluoropropane, 1,1,1,2,3,3-hexafluoropropane, 1,1,1,3,3,3-hexafluoropropane, 1,1,2,2,3,3-hexafluoropropane, 1,1,2,2,3-pentafluoropropane, 1,1,1,2,2-pentafluoropropane, 1,1,2,3,3-pentafluoropropane, 1,1,1,2,3-pentafluoropropane, 1,1,1,3,3-pentafluoropropane, 1,1,2,2-tetrafluoropropane, 1,1,1,2-tetrafluoropropane, 1,2,2,3-tetrafluoropropane, 1,1,1,3-tetrafluoropropane, 1,1,3,3-tetrafluoropropane, 1,1,2,3-tetrafluoropropane, 1,1,3-trifluoropropane, 1,1,2-trifluoropropane, 1,2,3-trifluoropropane, 1,1,2-trifluoropropane, 1,1,1-trifluoropropane, 1,1-difluoropropane, 1,2-difluoropropane, 2,2-difluoropropane, 1-fluoropropane, 2-fluoropropane, 1,1,3,3,3-pentafluoroprop-1-ene, 1,1,2,3,3-pentafluoroprop-1-ene, 1,2,3,3,3-pentafluoroprop-1-ene, 1,3,3,3-tetrafluoroprop-1-ene, 1,1,3,3-tetrafluoroprop-1-ene, 2,3,3,3-tetrafluoroprop-1-ene, 1,2,3,3-tetrafluoroprop-1-ene, 1,1,2,3-tetrafluoroprop-1-ene, 3,3,3-trifluoroprop-1-ene, 1,1,3-trifluoroprop-1-ene, 1,3,3-trifluoroprop-1-ene, 1,1,2-trifluoroprop-1-ene, 1,2,3-trifluoroprop-1-ene, 2,3,3-trifluoroprop-1-ene, 1,1-difluoroprop-1-ene, 1,3-difluoroprop-1-ene, 3,3-difluoroprop-1-ene, 1,2-difluoroprop-1-ene, 2,3-difluoroprop-1-ene, 1-fluoroprop-1-ene, 2-fluoroprop-1-ene, 3-fluoroprop-1-ene, 1,1,1,2,2,3,3,4,4-nonafluorobutane, 1,1,1,2,2,3,4,4,4-nonafluorobutane, 1,1,1,2,2,3,3,4-octafluorobutane, 1,1,1,2,2,4,4,4-octafluorobutane, 1,1,2,2,3,3,4,4-octafluorobutane, 1,1,1,2,2,3,4,4-octafluorobutane, 1,1,1,2,3,4,4,4-octafluorobutane, 1,1,1,2,3,3,4,4-octafluorobutane, 1,1,1,2,3,3-heptafluorobutane, 1,1,1,2,2,4,4-heptafluorobutane, 1,1,1,3,3,4,4-heptafluorobutane, 1,1,2,2,3,3,4-heptafluorobutane, 1,1,1,2,4,4,4-heptafluorobutane, 1,1,1,2,2,3,4-heptafluorobutane, 1,1,1,2,3,4,4-heptafluorobutane, 1,1,2,2,3,4,4-heptafluorobutane, 1,1,1,2,2,3-hexafluorobutane, 1,1,1,2,3,3-hexafluorobutane, 1,1,2,2,3,3-hexafluorobutane, 1,1,1,2,2,4-hexafluorobutane, 1,1,1,3,3,4-hexafluorobutane, 1,2,2,3,3,4-hexafluorobutane, 1,1,1,4,4,4-hexafluorobutane, 1,1,2,2,4,4-hexafluorobutane, 1,1,2,2,3,4-hexafluorobutane, 1,1,2,3,3,4-hexafluorobutane, 1,1,1,3,4,4-hexafluorobutane, 1,1,1,2,4,4-hexafluorobutane, 1,1,2,2,4,4-hexafluorobutane, 1,1,2,3,4,4-hexafluorobutane, 1,1,1,2,2-pentafluorobutane, 1,1,1,3,3-pentafluorobutane, 1,1,1,4,4-pentafluorobutane, 1,1,1,2,3-pentafluorobutane, 1,1,2,4-pentafluorobutane, 1,1,1,3,4-pentafluorobutane, 1,1,2,2,3-pentafluorobutane, 1,1,2,2,4-pentafluorobutane, 1,1,3,3,4-pentafluorobutane, 1,1,2,3,3-pentafluorobutane, 1,1,2,4,4-pentafluorobutane, 1,2,2,3,3-pentafluorobutane, 1,1,2,3,4-pentafluorobutane, 1,2,2,3,4-pentafluorobutane, 1,1,2,2,3,3,4-heptafluorocyclopentane, 1,1,2,2,3,3-hexafluorocyclopentane, 1h,2h-octafluorocyclopentane, 3,3,4,4,5,5-hexafluorocyclopentene, 1,3,3,4,4,5,5-heptafluorocyclopentene, 2h,3h-decafluoropentane, and 3,3,4,4,5,5,6,6,6-nonafluorohex-1-ene.

5. The etching gas composition of claim 1, wherein
   the organosulfur compound comprises a compound having a formula of $C_4F_6S$.

6. The etching gas composition of claim 1, wherein
   the first organofluorine compound comprises hexafluorobutene.

7. The etching gas composition of claim 1, wherein
the first organofluorine compound comprises at least one selected from the group consisting of 1,1,3,3,3-pentafluoro-2-(fluoromethyl)prop-1-ene, (3S,4R)-1,1,2,2,3,4-hexafluorocyclobutane, 2,3,3,4,4,4-hexafluoro-1-butene, 1,1,2,2,3,3-hexafluorocyclobutane, (2Z)-1,1,1,2,4,4-hexafluoro-2-butene, and (2E)-1,1,2,3,4,4-hexafluoro-2-butene.

8. The etching gas composition of claim 1, wherein
the organosulfur compound is present in the etching gas composition in an amount of about 10 parts to about 60 parts by mole based on 100 parts by mole of the first organofluorine compound.

9. The etching gas composition of claim 1, wherein
the second organofluorine compound and/or the third organofluorine compound is present in the etching gas composition in an amount of about 1 part to about 60 parts by mole based on 100 parts by mole of the first organofluorine compound.

10. The etching gas composition of claim 9, wherein
a ratio of a molar number of the second organofluorine compound to a molar number of the third organofluorine compound is in a range of about 10 to about 32.

11. A method of forming patterns, the method comprising:
forming a film on a substrate;
forming an etch mask on the film; and
etching the film by performing an etch process on the etch mask using the etching gas composition of claim 1.

12. An etching gas composition comprising:
a first organofluorine compound having a formula of $C_aF_bH_c$; and
an organosulfur compound having a formula of $C_xF_yS_z$, the organosulfur compound comprising at least one carbon-carbon double (—C═C—) bond,
wherein the organosulfur compound is present in the etching gas composition in an amount of about 10 parts to about 60 parts by mole based on 100 parts by mole of the first organofluorine compound,
wherein a is an integer of 3 to 6, b is an integer of 1 to 10, c is an integer of 1 to 6, x is an integer of 1 to 6, y is an integer of 1 to 16, and z is an integer of 1 to 4,
wherein the etching gas composition comprises both a second organofluorine compound and a third organofluorine compound, wherein the first, second and third organofluorine compounds are different from each other,
wherein the second organofluorine compound and/or the third organofluorine compound is present in the etching gas composition in an amount of about 1 part to about 60 parts by mole based on 100 parts by mole of the first organofluorine compound, and
wherein a ratio of a molar number of the second organofluorine compound to a molar number of the third organofluorine compound is in a range of about 10 to about 32.

13. The etching gas composition of claim 12, wherein
the organosulfur compound comprises a compound having a formula of $C_4F_6S$, and
the first organofluorine compound comprises at least one selected from the group consisting of trifluoropropane, tetrafluoropropane, pentafluoropropane, hexafluoropropane, tetrafluoropropene, difluoropropane, pentafluorobutane, heptafluorobutane, octafluorobutane, hexafluorobutene, decafluoropentane, hexafluorocyclopentane, heptafluorocyclopentane, octafluorocyclopentane, heptafluorocyclopentene, and nonafluorohexene.

14. The etching gas composition of claim 12,
wherein the second organofluorine compound comprises a C1 to C6 perfluorocarbon compound, and the third organofluorine compound comprises a C1 to C4 hydrofluorocarbon compound.

15. The etching gas composition of claim 14, wherein
the second organofluorine compound comprises tetrafluoromethane, tetrafluoroethene, hexafluoroethane, octafluoropropane, hexafluoropropene, octafluorobutene, hexafluorobutadiene, or decafluorocyclopentane.

16. The etching gas composition of claim 15, wherein the third organofluorine compound has a formula of $C_pH_qF_r$, wherein p is an integer of 1 to 4, each of q and r is an integer of 1 or more, q+r is an integer of 2p+2 or less, and r is greater than or equal to q.

* * * * *